United States Patent
Harada

(10) Patent No.: US 9,705,286 B2
(45) Date of Patent: Jul. 11, 2017

(54) METHOD FOR MANUFACTURING SEMICONDUCTOR DEVICE, AND SEMICONDUCTOR DEVICE

(71) Applicant: NICHIA CORPORATION, Anan-shi, Tokushima (JP)

(72) Inventor: Susumu Harada, Naruto (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/047,774

(22) Filed: Feb. 19, 2016

(65) Prior Publication Data

US 2016/0247682 A1    Aug. 25, 2016

(30) Foreign Application Priority Data

Feb. 23, 2015    (JP) ................................ 2015-033172

(51) Int. Cl.
| | | |
|---|---|---|
| H01S 5/22 | (2006.01) | |
| H01S 5/10 | (2006.01) | |
| H01S 5/16 | (2006.01) | |
| H01S 5/20 | (2006.01) | |
| H01S 5/343 | (2006.01) | |

(52) U.S. Cl.
CPC .............. *H01S 5/22* (2013.01); *H01S 5/1017* (2013.01); *H01S 5/16* (2013.01); *H01S 5/2081* (2013.01); *H01S 5/2214* (2013.01); *H01S 5/34333* (2013.01)

(58) Field of Classification Search
CPC ......... H01S 5/0452; H01S 5/22; H01L 33/36; H01L 33/38; H01L 33/385
See application file for complete search history.

(56) References Cited

U.S. PATENT DOCUMENTS

| | | |
|---|---|---|
| 2001/0053570 A1 | 12/2001 | Kido |
| 2003/0128729 A1 | 7/2003 | Matsumura |
| 2005/0170542 A1 | 8/2005 | Matsumura |
| 2009/0129418 A1 | 5/2009 | Matsumura |
| 2009/0323750 A1* | 12/2009 | Inoue ...................... B82Y 20/00 372/46.01 |

(Continued)

FOREIGN PATENT DOCUMENTS

| | | |
|---|---|---|
| JP | 05-013401 A | 1/1993 |
| JP | 06-120201 A | 4/1994 |

(Continued)

*Primary Examiner* — Bryan Junge
(74) *Attorney, Agent, or Firm* — Global IP Counselors, LLP

(57) ABSTRACT

With a method for manufacturing a semiconductor device, a semiconductor layer having a protrusion on a main face is formed. The protrusion includes an upper face and side faces. A conductive layer on a region that includes at least the upper face and the side faces of the protrusion is formed. A first mask that partially covers a surface of the conductive layer is formed. A part of the conductive layer is etched by using the first mask in a first etching process. A second mask that at least partially covers the surface of the conductive layer that has undergone the first etching process is formed. A part of the conductive layer is etched by using the second mask to expose a part of the semiconductor layer and to form the conductive layer into an electrode in a second etching process.

19 Claims, 5 Drawing Sheets

(56) References Cited

U.S. PATENT DOCUMENTS

| | | | |
|---|---|---|---|
| 2010/0085996 A1* | 4/2010 | Matsuno | B82Y 20/00 372/46.01 |
| 2010/0085997 A1* | 4/2010 | Nishikawa | B82Y 20/00 372/46.01 |
| 2010/0278207 A1* | 11/2010 | Sonobe | B82Y 20/00 372/46.012 |
| 2012/0114004 A1* | 5/2012 | Satoh | B82Y 20/00 372/50.1 |

FOREIGN PATENT DOCUMENTS

| | | |
|---|---|---|
| JP | 2000-340887 A | 12/2000 |
| JP | 2001-358404 A | 12/2001 |
| JP | 2002-334830 A | 11/2002 |
| JP | 2002-374035 A | 12/2002 |
| JP | 2010-258064 A | 11/2010 |

* cited by examiner

METHOD FOR MANUFACTURING SEMICONDUCTOR DEVICE, AND SEMICONDUCTOR DEVICE

CROSS-REFERENCE TO RELATED APPLICATIONS

This application claims priority to Japanese Patent Application No. 2015-033172 filed on Feb. 23, 2015. The entire disclosure of Japanese Patent Application No. 2015-033172 is hereby incorporated herein by reference.

BACKGROUND

1. Technical Field

The present disclosure relates to a method for manufacturing a semiconductor device, and to a semiconductor device.

2. Description of Related Art

A method that was commonly known in the past when a metal film was formed as a pattern in a semiconductor manufacturing process involved forming a resist on the layer to be worked, patterning the resist by exposure to light to create a mask, and dissolving the worked layer with a chemical etching solution to form a pattern. It has been proposed with this method, for example, that the amount of side etching can be reduced by increasing adhesion between the resist and the worked layer (for example, JPH5-13401A).

It has also been proposed that a resist be subjected to reflow with a solvent or under heating, which allows the planar dimensions of the resist mask to be expanded prior to the second etching, and reduces the steps entailed (for example, JP2002-334830A).

Furthermore, it has been proposed that in the formation of a pattern by exposing a resist layer that will serve as a mask to light, a semi-exposed portion be provided at the boundary between the exposed portion and unexposed portion of the resist layer, and the semi-exposed portion of the resist layer removed in the same manner as the worked layer in a wet etching step to reduce the amount of side etching (JPH6-120201A).

SUMMARY

Fine working is possible by using dry etching, which allows ion etching and other such anisotropic etching, but this entails the installation of large equipment decreases product processing capability, so it drives up the manufacturing cost.

Also, with a pattern formation method that features wet etching, which affords easy high-volume processing and lower cost, the etching tends to proceed in the same direction, so side etching occurs in which the worked layer at the lower part of the mask pattern is also removed. In the case where side etching proceeds in the formation of an electrode, there will be a reduction in the contact surface area, and this may result in the problem of a voltage increase.

A method for manufacturing a semiconductor device according to one aspect includes: forming a semiconductor layer having a protrusion on a main face, the protrusion having an upper face and side faces; forming a conductive layer on a region that includes at least the upper face and the side faces of the protrusion; forming a first mask that partially covers a surface of the conductive layer; etching a part of the conductive layer by using the first mask in a first etching process; forming a second mask that at least partially covers the surface of the conductive layer that has undergone the first etching process; and etching a part of the conductive layer by using the second mask to expose a part of the semiconductor layer and to form the conductive layer into an electrode in a second etching process.

A method for manufacturing a semiconductor device according to another aspect includes: forming a semiconductor layer having a protrusion on a main face, the protrusion having at an upper face and side faces; forming a conductive layer on a region that includes at least the upper face and the side faces of the protrusion; forming a first mask that partially covers a surface of the conductive layer; etching a part of the conductive layer by using the first mask in a first etching process; removing the first mask; forming a second mask that covers from a part of the surface of the conductive layer that was exposed after removal of the first mask to a part of the surface of the conductive layer that has undergone the first etching process; and etching a part of the conductive layer by using the second mask to expose a part of the semiconductor layer and to form the conductive layer into an electrode in a second etching process.

A semiconductor device according to another aspect includes a semiconductor layer and an electrode. The semiconductor layer having a main face and a first end, which is an end that intersects a first direction, the semiconductor layer having a protrusion that extends in the first direction. The electrode disposed on at least an upper face and side faces of the protrusion, the electrode being disposed at a first distance in the first direction away from the first end, and a thickness of a portion of the electrode formed on a first end side being less than a thickness a portion of the electrode formed on an interior side.

Disclosed herein provides a method for manufacturing a semiconductor device with which less side etching occurs in the formation of an electrode, and there is less of an increase in voltage attributable to decreased electrode surface area.

Also, disclosed herein provides a semiconductor device with which there is less of a decrease in electrode surface area attributable to side etching, the proper electrode surface area can be ensured, and a voltage rise can be suppressed.

DETAILED DESCRIPTION

Figure 1:
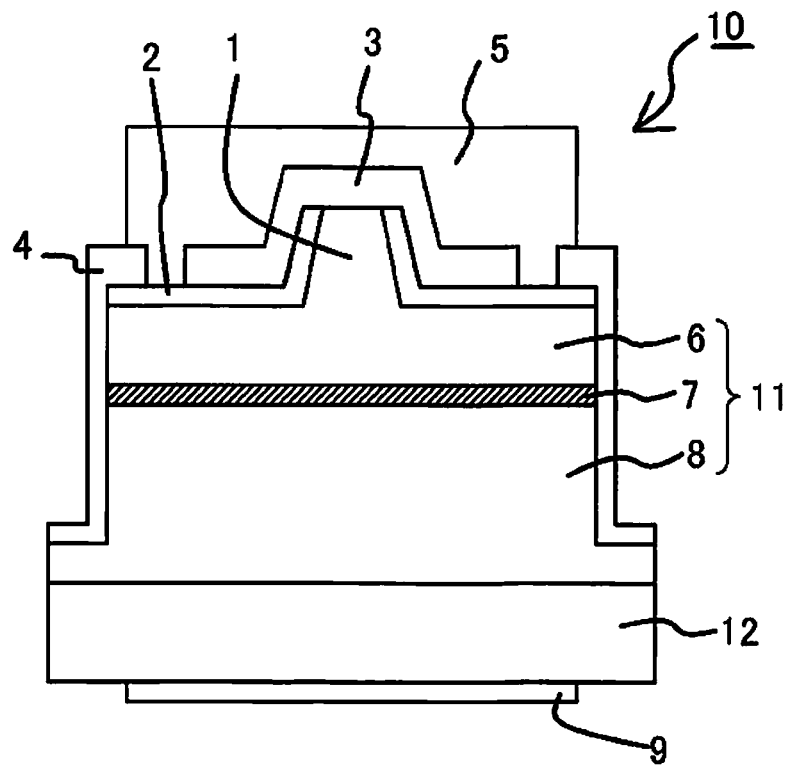
FIG. 1 is a schematic horizontal cross sectional view of an embodiment of the semiconductor device disclosed herein.

Embodiments for implementing the method for manufacturing the semiconductor device and the semiconductor device of the disclosure will be described below with reference to the accompanying drawings. In the following embodiment of the method for manufacturing the semiconductor device and the semiconductor device that embody the technological concept of the present disclosure are just examples, and unless otherwise specified, the constituent parts discussed in the embodiments are not intended to limit the scope of the present disclosure. Further, constitutions described in examples and the embodiments can be employed in other examples and embodiments.

The sizes and the arrangement relationships of the members in each of drawings are occasionally shown exaggerated for ease of explanation.

The method for manufacturing the semiconductor device disclosed herein mainly includes forming an electrode by forming a conductive layer on a semiconductor layer, subjecting the conductive layer to first etching with a first mask, and then subjecting it to second etching with a second mask.

Formation of Conductive Layer

First, the conductive layer is formed on the semiconductor layer.

The semiconductor layer is a member constituting part of a semiconductor device. The semiconductor device here is preferably a laser device, a light emitting diode, or another such light emitting device, but may instead be a transistor, an integrated circuit, a resistor, a memory, or the like. A laser device is particularly preferable.

Examples include $In_XAl_YGa_{1-X-Y}N$ ($0 \leq X$, $0 \leq Y$, $X+Y \leq 1$) and other such nitride semiconductor materials.

The semiconductor layer usually consists of a plurality of laminated layers. For instance, it may consist of a first-conductivity-type semiconductor layer and a second-conductivity-type semiconductor layer, and an active layer that is disposed between the first-conductivity-type semiconductor layer and the second-conductivity-type semiconductor layer. The first-conductivity-type semiconductor layer and the second-conductivity-type semiconductor layer may have a single-layer structure, or may have a laminated structure. The active layer may have a single quantum well structure or a multiple quantum well structure formed on a thin film that produces a quantum effect.

The semiconductor layer is preferably formed of $In_xGa_{1-x}N$ ($0<x \leq 1$), $Al_yGa_{1-y}N$ ($0<y \leq 1$), GaN, or another such laminated structure by MOCVD, MBE, or another such known vapor growth method, usually on a substrate made of a nitride semiconductor or the like. A substrate does not necessarily have to be used in the semiconductor device.

The semiconductor layer preferably has a protrusion on a main face. There are no particular restrictions on the height, shape, and so forth of the protrusion, and it can be in the form of an island, a stripe, a lattice, etc., and in plan view it can be circular, elliptical, polyhedral, or any of various other shapes. For instance, the protrusion preferably has a shape that extends in a particular direction (such as the first direction). More specifically, it is more preferably a stripe-shaped ridge along a laser device. The protrusion (particularly a ridge) more specifically preferably has a width of about 1 to 100 μm, with about 1 to 70 μm being more preferable. Its height (the depth of etching in the formation of the protrusion) can be suitably adjusted according to the thickness, material, and so forth of the layer constituting the second-conduction-type semiconductor layer, an example of which is about 0.1 to 2 μm. Its length is preferably about 100 μm to 2 mm. The protrusion may not be the same width all the way along its lengthwise direction, and its side faces may be vertical or may be tapered.

One protrusion, or a plurality of them, may be formed on a main face of the semiconductor layer.

The protrusion can be formed, for example, by forming a mask pattern on the surface of the second-conduction-type semiconductor layer, and using this mask pattern as a mask in etching. The mask pattern can be formed by photolithography and etching or another known method, using a resist, $ZrO_2$, $SiO_2$, or another such insulating film. In the case where the second-conduction-type semiconductor layer is a nitride semiconductor layer, the etching is preferably reactive ion etching (RIE) in which $Cl_2$, $CCl_4$, $SiCl_4$, $BCl_3$, or another such chlorine-based gas is used.

The semiconductor layer having a protrusion on a main face preferably has a first protective film on a main face, prior to the formation of the conductive layer (discussed below). The first protective film here preferably has an opening that partially exposes the semiconductor layer in order to ensure an electrical connection between the semiconductor layer and the conductive layer. For example, the first protective film preferably has an opening on the upper face of the protrusion, and may open to above the side face of the protrusion. In particular, in the case where the protrusion is a stripe-shaped ridge, the first protective film is preferably formed so as to expose substantially all of the upper face of the ridge. The shape of the opening in the first protective film can be almost the same as that of the electrode obtained by working the conductive layer, and the first protective film and the electrode may partially overlap.

The first protective film can be formed from a single-layer or laminated film made of an oxide, nitride, or the like of Si, Al, Zr, Ti, Nb, Ta, etc. Typically, an insulating material is selected. There are no particular restrictions on the thickness of the first protective film, but about 10 nm to 2 μm is preferable, and about 10 nm to 50 nm is more preferable, for example.

The first protective film can be formed, for example, by forming a material film that constitutes the first protective film on a semiconductor layer in a state in which the mask pattern used in the above-mentioned formation of the protrusion is still there, and then removing the mask pattern and the material film constituting the first protective film that is on the mask pattern. These can be removed by a lift-off method in which patterning is done by dissolving away the mask pattern with a stripping solution.

In addition to the above-mentioned protrusion, the semiconductor layer may have a recess on the main face on which the protrusion is disposed. One recess is preferably disposed on each side of the protrusion. In this case, the pair of recess are preferably symmetrical with respect to the protrusion, but may instead be asymmetrical. This decreases a possibility of linking of the two recesses straddling the protrusion. The depth of the recess is preferably enough to reach the first-conduction-type semiconductor layer, for example.

In particular, in the case where the protrusion is a ridge on a laser device, providing this recess allows any light that leaks out from the optical waveguide region of the laser device to be scattered by the recess. Therefore, there will be less mixing of light that has leaked from the optical waveguide region (stray light) into the main beam of the laser device, and a laser device having an FFP with reduced ripple can be obtained. Also, using the above-mentioned depth allows light that has leaked out laterally from the active layer to be scattered more effectively. The recess is preferably formed on the side of the emission end face where the laser light is emitted, in the case where the protrusion is a ridge on a laser device. This allows the above-mentioned action to be exhibited more effectively.

The recess is preferably formed no more than a few dozen microns away from the protrusion, and more preferably is formed no more than about a dozen microns away. Also, the recess is preferably formed within a few dozen microns, and more preferably about a dozen microns, from the planned division line. The recess, in plan view, can be circular, elliptical, hexagonal, triangular, linear, or any of various other shapes. Also, the width of the recess at its narrowest portion in plan view is preferably at least 0.1 μm, and more preferably at least 0.5 μm.

The recess preferably ends up being empty, but may be filled in with a metal oxide such as, Ni, Cr, Ti, Cu, Fe, Zr, Hf, Nb, W, Rh, Ru, Mg, Si, Al, Sc, Y, Mo, Ta, Co, Pd, Ag, Au, Pt, In, a light absorbing layer made of one of these oxides, etc., or the above-mentioned first protective film. In the case where a conductive material is disposed inside the recess, there will be a greater risk of leakage, so the material that fills in the recess is preferably an insulating material.

The recess can be formed by the methods discussed in JP 2005-311308A and JP2014-138005A, or by a method according to one of these. For instance, the recess can be formed by changing the shape of the mask pattern used in the formation of the above-mentioned protrusion to a shape having an opening in the region where the recess is formed, or by forming a mask pattern having an opening in the region where the recess is formed, either before or after forming the protrusion, and using the RIE performed in forming the protrusion or other method.

The conductive layer is formed in a region that includes at least the upper face and the side faces of the protrusion. There are no particular restrictions on the material of the conductive layer used here, but examples include single-layer films and multilayer films made of metals such as Ni, Rh, Cr, Au, W, Pt, Ti, Al, and alloys thereof, or conductive oxides or the like including at least one type selected from among zinc, indium, tin, and magnesium such as ZnO, $In_2O_3$, $SnO_2$, ITO (Indium Tin Oxide), IZO (Indium Zinc Oxide), GZO (Gallium-doped Zinc Oxide). Among of, the conductive oxides or alloy is preferred. There are no particular restrictions on the thickness of the conductive layer, which can be suitably adjusted according to the material being used and so forth, but usually the layer may be thick enough to function as an electrode of a semiconductor device. A range of about 0.5 to 1 μm can be used, for example.

The conductive layer need not be formed on the entire upper face of the protrusion, and also need not be formed on the entire side faces of the protrusion. That is, the conductive layer may be formed on part of the upper face, part of the side faces in their height direction, or on one of the plurality of side faces. In the case where the protrusion is in the form of a stripe, the conductive layer is preferably formed in substantially the entire region of the upper face of the protrusion and the entire region of the two side faces running in the direction in which the protrusion extends. The conductive layer may be formed all the way to on the semiconductor layer on both sides of the protrusion. In particular, the conductive layer is preferably formed on substantially the entire upper face and substantially the entire side faces of the protrusion (in the case where in the form of a stripe, for example, substantially the entire region of the two side faces extending in the direction in which the protrusion extends), and on the semiconductor layer that includes the faces (e.g., flat faces) on both sides of the protrusion.

As discussed above, in the case where the semiconductor layer has a recess on its main face, a conductive layer may be formed in the recess. In this case, the conductive layer inside the recess is preferably removed by second etching or third etching (discussed below). This decreases a possibility of leakage from being caused by the conductive layer.

First Etching

The first etching is a step in which part of the surface of the conductive layer is etched. Accordingly, a first mask that covers part of the surface of the conductive layer is formed. The first mask can be formed from a single-layer structure or a multilayer structure of a known material, such as a resist layer or an insulating film. The first mask may be divided up into a plurality of parts on the conductive layer, or it may be disposed in a shape having one or more openings.

In the case where the semiconductor device is a laser device equipped with a ridge, for example, the first mask preferably covers the conductive layer so that it will subsequently be away from the line that becomes the cavity surface, in plan view. In other words, in the case where the protrusion has a shape that extends in a first direction, the first mask is preferably formed a first distance in the first direction away from the planned division line where the semiconductor layer is divided after the conductive layer has been worked into an electrode, which an imaginary line that intersects this first direction. The distance equivalent to the first distance here can be suitably set according to the size of the semiconductor device and so forth. In the case where the distance is too short, the distal end part will be susceptible to catastrophic optical damage (COD), but in the case where the distance is too long, start-up kink characteristics will tend to suffer, so a range of about 2 to 10 μm is preferable, for example.

The etching in which the first mask is used may be either wet or dry etching. Examples of dry etching include sputtering, ashing, and RIE. Of the two, wet etching is preferable. Wet etching can be performed using any method, conditions, and materials known in this field.

In the first etching, only part of the conductive layer in the film thickness direction is removed, and part of the conductive layer in the film thickness direction is left behind. This partial removal in the film thickness direction preferably leaves at least 30% of the thickness of the conductive layer, and more preferably about 40 to 60%. In the case where an electrode is formed on the protrusion (on just the upper face of the protrusion, or on the upper face and the side faces), the first mask is formed in a shape that covers the protrusion from the top. Since the conductive layer near the side faces of the protrusion here are prone to being side-etched (over-etched), in the case where all of the conductive layer in the film thickness direction may be removed with just the first mask to work the layer into an electrode, then there will be the risk of reducing the surface area of the electrode through over-etching. However, since only part of the conductive layer in the film thickness direction is removed in the first etching, the surface of the semiconductor layer is not exposed, and the amount of over-etching will not affect the electrode surface area.

The precision of the etching for removing or leaving behind the conductive layer can be controlled by means of the etching duration, the type of etchant, the temperature of the etchant, the material of the conductive layer, the laminated structure that constitutes the conductive layer, and so forth.

Second Etching

The second etching is a step in which the conductive layer is etched and worked into an electrode. To this end, a second mask is formed. The second mask can be formed in a single-layer structure or a multilayer structure from known materials, such as a resist layer or an insulating film. The second mask may be divided up into a plurality of parts, or it may be disposed in a shape having one or more openings.

In one embodiment, the second mask can be formed without removing the first mask (with it still in place). In another embodiment, the second mask may be formed after the first mask has been removed.

In the case where the second mask is formed without removing the first mask (with it still in place), the second mask is preferably formed in a shape that covers at least part of the surface of the conductive layer that has undergone the first etching. That is, the second mask leaves uncovered part of the conductive layer that was partially removed in the film thickness direction by the first etching, and covers the other part. In this case, the second mask does not need to cover the remaining first mask, but the second mask is preferably formed in a shape that covers part of the surface of the conductive layer that has undergone the first etching, from above the first mask, in order to avoid the etching of the conductive layer at the site of the second etching (discussed below) when there is a gap between the end of the first mask and the end of the second mask. In the case where the second mask is formed without removing the first mask (with it still in place), the first mask and second mask can be removed at substantially the same time by dipping them in a stripping solution after the second etching, so there will be less increase in the number of steps.

In the case where the second mask is formed after the first mask has been removed, the second mask preferably covers from the part of the surface of the conductive layer exposed after the removal of the first mask, to the part of the surface of the conductive layer that has undergone the first etching. It is particularly preferable for the second mask to leave uncovered all of the surface of the conductive layer exposed after the removal of the first mask and part of the conductive layer that was partially removed in the film thickness direction by the first etching, and to continuously cover the other part.

There are no particular restrictions on the shape and size of the second mask when it covers the surface of the conductive layer that has undergone the first etching, and these can be set as desired. For example, in the case where the semiconductor device is a laser device equipped with a ridge, the second mask is preferably formed away (in plan view) from the line that will become the cavity surface of the laser device, or in other words, a second distance away in the first direction from the planned division line where the semiconductor layer is divided up after the conductive layer has been worked into an electrode, which is an imaginary line that intersects the above-mentioned first direction. The distance equivalent to the second distance here can be suitably set according to the size of the semiconductor device and so forth. For example, this distance is preferably shorter than the first distance, and more preferably about 10 to 90% of the first distance, and even more preferably about 30 to 60%.

The etching in which the second mask is used may be either wet or dry etching, but wet etching is preferable. That is, the first etching and/or the second etching is preferably performed by wet etching, and more preferably the first etching and the second etching are both performed by wet etching.

The second etching is performed so as to remove the entire conductive layer in the film thickness direction. That is, the second etching is performed so as to expose part of the main face of the semiconductor layer. The second etching may be performed for a longer or shorter time than the first etching. In the case where the goal is to minimize damage caused by etching to the main face of the semiconductor layer, and/or to have less over-etching than in the first etching, the second etching can be performed under more moderate conditions and/or for a shorter time than the first etching. At the same time, the conductive layer at the portion covered by the first mask will remain in its original film thickness, so voltage rise problems caused by a reduction in electrode surface area can be effectively curtailed.

Also, as discussed above, in the case where the semiconductor layer has a recess on its main face, and the conductive layer is formed inside this recess, then the conductive layer in the recess can also be etched by the second etching. However, depending on the depth and size of the recess, the thickness of the conductive layer, and so forth, not all of the conductive layer in the recess need be removed.

The electrode produced by the conductive layer on the main face of the semiconductor layer can be patterned by the above-mentioned first and second etching. The electrode that is obtained here has a step at its end that is attributable to the first etching and second etching. That is, the end of the electrode has a portion that is thinner than in the interior.

The conductive layer has a general tendency to be etched more near the side faces of the protrusion, that is, near the side faces of the ridge on the semiconductor layer surface. In particular, in the case where the etching is done by wet etching, the etchant will tend to work its way in along the side faces of the ridge from the ends in the direction in which the ridge extends. Therefore, two-stage etching makes it less likely that the etchant will work its way into the side faces of the ridge, and because the side faces of the exposed protrusion are covered by the conductive layer at an adequate distance, over-etching can be effectively decreased. In particular, this tendency is believed to be more pronounced in the case where the conductive layer is composed of two or more devices, such as a conductive oxide or an alloy, because the composition near the side faces of the protrusion will tend to be different from that of the other portions.

Third Etching

As discussed above, in the case where the semiconductor layer has a recess on its main face, and in the case where a first protective film remains inside the recess and/or in the case where the conductive layer remains inside the recess, a third mask is preferably used to perform third etching.

The third mask is preferably formed in a shape that covers the side faces of the electrode worked by the second etching, from above the semiconductor layer exposed by the second etching. With a third mask of this shape, the first protective film and/or the conductive layer inside the recess is removed, so over-etching near the side faces of the protrusion can be effectively decreased in the conductive layer that is supposed to be disposed in a specific film thickness. As a result, a reduction in electrode surface area in the semiconductor device, and a reduction in the contact surface area between the semiconductor layer and the electrode can be effectively decreased. In the case where the first and second masks are removed before performing the third etching, the third mask is preferably formed in a shape that also covers the portions covered by the first and second masks.

The third etching can be performed in a similar manner to the first etching and second etching. More specifically, the third etching can be performed in a similar manner to the second etching and/or the first etching, or can be performed under more stringent conditions and/or for a longer time than the first etching. It is possible that part of the first protective film and/or the conductive layer formed inside the recess will already have been removed by the second etching, so the first protective film and/or the conductive layer inside the recess can be removed substantially completely by etching under more stringent conditions or for a longer time. The conductive layer and so forth remaining in other locations can also be reliably removed.

Yet another etching can also be performed in between the first etching and the second etching. In this case, the mask size and the etching amount may be adjusted so that the mask formation surface area and the etching removal depth will increase in steps from the first etching to the second etching. However, more steps equates to higher cost, so in terms of keeping the cost low, the electrode is preferably worked in just the first etching and second etching. For example, in the case where the thickness of the conductive layer is about 0.5 to 1 µm, sufficient working can be achieved with just the first etching and second etching.

With the method for manufacturing a semiconductor device disclosed herein, one or more of the following steps (1) to (4) may be added as desired.

(1) A second protective film that covers the side faces of the semiconductor layer is preferably formed after the electrode has been formed as above. As long as it has an opening on the electrode, the second protective film may be formed not only on the side faces of the semiconductor layer, but also on the electrode and/or the main face of the semiconductor layer where the electrode has not been formed.

The second protective film can be formed in the desired shape by any method known in this field for forming a film. It can be formed from a material selected from among the same as those of the first protective film. There are no particular restrictions on the thickness of the second protective film, but an example is a range of about 100 nm to 1 µm.

(2) An electrically connected pad electrode that covers the electrode is preferably formed on this electrode. The pad electrode is preferably a laminated film composed of Ni, Ti, Au, Pt, Pd, W or another such metal. The thickness, shape, size, and so forth of the pad electrode can be suitably set by a method known in this field according to the intended performance of the semiconductor device and so on.

(3) A second electrode is preferably formed on the face of the substrate on which the semiconductor layer is laminated, on the opposite side from the semiconductor layer (this will sometimes be referred to below as the rear face). For example, the rear face of the substrate can be polished after the lamination of the semiconductor layer to make it into a thin-film with a specific thickness, such as about 50 to 150 µm, after which a laminated film composed of V, Ti, Pt, Au, or another such metal is formed and patterned.

(4) The substrate on which the semiconductor layer is formed is preferably divided into units constituting individual semiconductor devices. This division is preferably performed after all of the above steps have been performed.

The division is preferably accomplished by laser irradiation, blade breaking, roller breaking, or the like. This division forms a face that is split in a direction perpendicular to the protrusion, and more particularly the ridge, after which this face serves as a cavity surface, and a dielectric multilayer film is formed as a reflective mirror, which is made of $SiO_2$, $ZrO_2$, $TiO_2$, $Al_2O_3$, $Nb_2O_5$ and another oxides. Furthermore, the substrate on which the semiconductor layer is formed is preferably split parallel to the protrusion, and particularly the ridge. This allows the semiconductor devices to be made into chips.

Semiconductor Device

The semiconductor device disclosed herein includes a semiconductor layer and an electrode. The semiconductor layer has a main face, and a protrusion that extends in a first direction is on this main face. The electrode is usually disposed at least on the upper face of the protrusion.

In the case where the semiconductor device is a laser device, for example, the protrusion is preferably a ridge for forming an optical waveguide, and is preferably formed in a first direction corresponding to the direction in which the semiconductor device extends. In the case where the semiconductor layer has a hexagonal crystal system, for example, and its main face is a C plane (0001), the first direction can be a direction perpendicular to the M plane (that is, a direction parallel to the A plane), etc. With a GaN-based laser device such as this, the M plane of the GaN semiconductor layer serves as a cleavage plane, and this face can be used as a cavity surface.

The electrode is preferably disposed a first distance in the first direction away from the first end of the semiconductor layer, which is an end that intersects the first direction.

It is also preferable for the first end side to be thinner than the interior side. Making the first end side thinner can reduce the stress exerted on the semiconductor layer by the conductive layer, and effectively decrease a possibility of the separating of the conductive layer from the semiconductor layer end side.

The first distance can be suitably adjusted according to the size of the semiconductor device, etc. For instance, about 2 to 10 µm is preferred.

The reduced film thickness here is preferably more than 50% of the film thickness on the interior side (such as the thickness near the center of the electrode), with about 60 to 70% being more preferred.

The electrode is preferably such that the thickness on the second end side, which is the end of the semiconductor layer extending in the first direction, is less than the thickness on the interior side. The thickness relation between the thinner portion on the second end side and the thicker portion on the interior side is preferably similar to the thickness relation at the first end.

The electrode is preferably such that its width at the thinner portion on the first end side is greater than the electrode width at the thinner portion on the second end side. The electrode width here can be suitably set according to the intended size of the semiconductor device, etc. For instance, the electrode width at the thinner portion on the second end side may be about 5 to 90% of the electrode width at the thinner portion on the first end side.

The semiconductor device may further includes a second electrode on the opposite side from the electrode produced by the first protective film, the second protective film, and the conductive layer. In the case where the semiconductor device has a conductive substrate, the second electrode is preferably provided on the opposite side from the face of the conductive substrate where the semiconductor layer is provided. The first protective film here mainly protects the side faces of the protrusion, and the second protective film preferably has the role of protecting the side faces of the semiconductor layer.

Examples of the method for manufacturing a semiconductor device and the semiconductor device disclosed herein will now be described in detail through reference to the drawings. The specific dimensions and materials discussed in the embodiments are just examples, and do not limit the present invention.

Embodiment 1

In this embodiment, the semiconductor device is the laser device 10 shown in FIG. 1, and primarily has a semiconductor layer 11 and a p electrode 3 formed on a main face of the semiconductor layer 11.

The semiconductor layer 11 has a rectangular shape in plan view, measuring about 200×800 µm. The semiconductor layer 11 is usually formed on a substrate that is a few inches in diameter, after which the electrodes and so forth are formed, and these are then separated into individual rectangular laser devices. Prior to this separation, the imaginary lines indicating the expected positions for division into individual units are planned division lines, which include a planned division line extending parallel to the first direction (M in FIG. 7C), and a planned division line extending in a direction that intersects (typically, one that is perpendicular to) the first direction.

The semiconductor layer 11 consists of an n-type semiconductor layer 8, an active layer 7, and a p-type semiconductor layer 6 that are laminated on a conductive substrate 12. A stripe-shaped ridge 1 that is about 0.5 µm tall and about 2 µm wide is provided to the surface of the p-type semiconductor layer 6.

A first protective film 2 composed of $ZrO_2$ (or $SiO_2$) is formed all the way from substantially the entire side faces extending in the stripe direction of the ridge 1 (extending in the first direction) to the upper face of the p-type semiconductor layer 6. The upper face of the ridge 1 is exposed from the first protective film 2. The first protective film 2 may extend to the end of the semiconductor layer 11 in a second direction (L in FIG. 7C) that is perpendicular to the first direction, but here it does not extend to the end of the semiconductor layer 11, and the end of the p-side semiconductor layer 6 is exposed.

The p electrode 3 connects to the upper face of the ridge 1 exposed from the first protective film 2, and is disposed in a shape that goes from both side faces of the ridge 1 to on the p-side semiconductor layer 6.

Part of the upper face and side faces of the semiconductor layer 11 is covered by a second protective film 4 composed of $SiO_2$.

A p pad electrode 5 is disposed from on the p electrode 3 to on the p-type semiconductor layer 6 (the surface of the first protective film 2 and the second protective film 4) so as to connect with the p electrode 3.

The laser device 10 further has a substrate 12 that is composed of conductive GaN and on which the semiconductor layer 11 is laminated, and an n electrode 9 formed on the substrate 12.

This laser device can be manufactured by the following method. First, the semiconductor layer 11 is formed on a GaN substrate. The semiconductor layer 11 are laminated with $Al_xGa_{1-x}N$ (0<x≤0.5, cladding layer) as a first n-type semiconductor layer, $Al_xGa_{1-x}N$ (0≤x≤0.3, light guide layer) as a second n-type semiconductor layer, $In_yGa_{1-y}N$ (0≤y<1, quantum well structure) as an active layer, $l_xGa_{1-x}N$ having p-type impurities (0≤x≤0.5, p side electron confining structure) as a first p-type semiconductor layer, $Al_xGa_{1-x}N$ (0≤x≤0.3) as a second p-type semiconductor layer, $Al_xGa_{1-x}N$ having p-type impurities (0<x≤0.5, superlattice structure of GaN/AlGaN, cladding layer) as a third p-type semiconductor layer and $Al_xGa_{1-x}N$ having p-type impurities (0≤x≤1) as a forth p-type semiconductor layer, in this order on the substrate.

Then, a mask pattern having a shape corresponding to the ridge and composed of a resist is formed by photolithography and etching on the surface of the semiconductor layer 11, and this mask pattern is used to form the ridge 1 by RIE, in which a chlorine-based gas is used.

After this, a film composed of $ZrO_2$ is formed on the semiconductor layer 11 while the mask pattern is left in place, then the mask pattern is lifted off by wet etching to form the first protective film 2 exposed only at the upper face of the ridge 1.

An ITO film is then formed in a thickness of 200 nm on the semiconductor layer 11, including the ridge 1 and the first protective film 2.

Figure 2A:
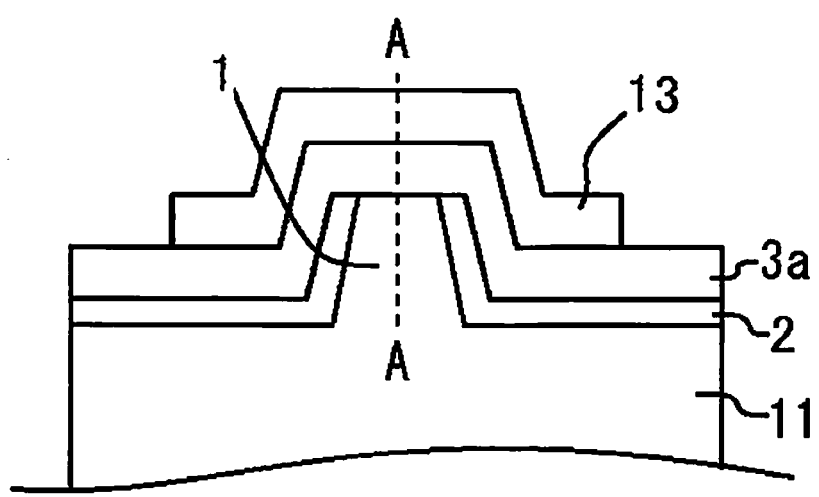
FIG. 2A is a schematic horizontal cross sectional processing view illustrating the manufacturing method of the semiconductor device of Embodiment 1.
Figure 2B:
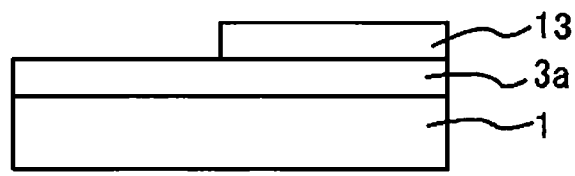
FIG. 2B is a schematic vertical cross sectional processing view along the A-A line in FIG. 2A.

As shown in FIGS. 2A and 2B, the ITO film 3a is covered by a first resist, and a first mask 13 is formed by photolithography and etching. FIG. 2B is a vertical cross section along the A-A line in FIG. 2A, and is a detail view of the area around the portion that becomes the emission end face (the first end) after separation into individual units. The first mask 13 is rectangular in plan view, the end on the short-edge side is located about 8 µm to the inside in the first direction from the planned division line that intersects the first direction, and the long-edge side is located about 80 µm to the inside in the second direction from the planned division line parallel to the first direction.

Figure 2C:
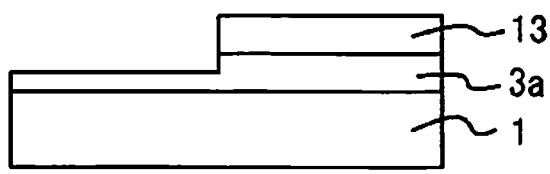
FIG. 2C is a schematic vertical cross sectional processing view illustrating the manufacturing method following FIGS. 2A and 2B.

As shown in FIG. 2C, first etching is performed for 9 minutes at an etching rate of 10 nm per minute, using the first mask 13 as a mask, and using an etchant composed of a mixture of 10% nitric acid, 18% hydrochloric acid, and 72% water. After this, the first mask 13 is removed by stripping and washing with an organic solvent.

Figure 2D:
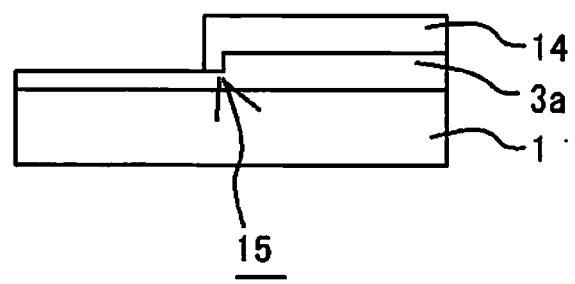
FIG. 2D is a schematic vertical cross sectional processing view illustrating the manufacturing method following FIG. 2C.

As shown in FIG. 2D, the resulting semiconductor layer 11 is covered with a second resist film, and a second mask 14 is formed by photolithography and etching. The second mask 14 is formed to be 2 µm larger in the first direction than the first mask 13. The second mask is preferably at least 0.5 µm larger, the result of which is that side etching can be effectively decreased, and being at least 1.5 µm larger is even better.

Figure 2E:
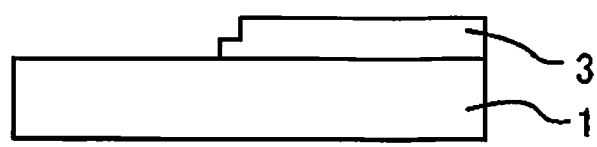
FIG. 2E is a schematic vertical cross sectional processing view illustrating the manufacturing method following FIG. 2D.

Second etching is performed for 16 minutes using the second mask 14 as a mask, and the surface of the semiconductor layer 11 is exposed as shown in FIG. 2E. This allows the ITO film to be patterned in the shape of the p electrode 3 (the desired shape).

Figure 3:
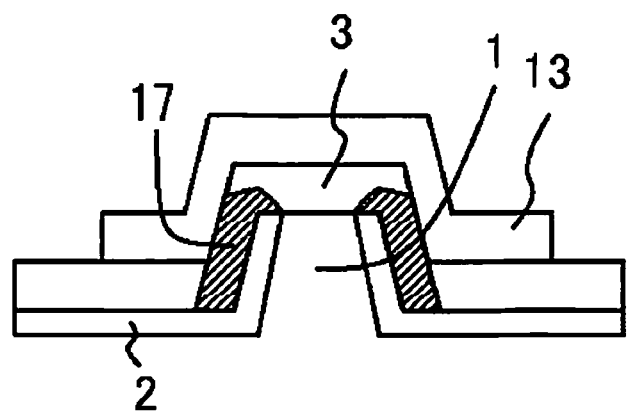
FIG. 3 is a schematic horizontal cross sectional view of an embodiment of the semiconductor device disclosed herein.

The second mask 14 is formed so as to be larger than the first mask 13, and performing the second etching protects the end face 15, which is the cause of side etching in ordinary etching, while allowing the conductive layer to be patterned in the desired shape, so side etching of the p electrode 3 can be effectively decreased. Therefore, as shown in FIG. 3, less over-etching occurs near the ridge side wall 17, and the electrode can be worked more accurately.

Figure 2F:
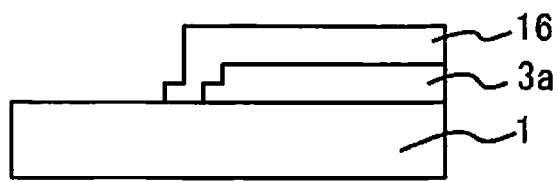
FIG. 2F is a schematic vertical cross sectional processing view illustrating the manufacturing method following FIG. 2E.
Figure 4:
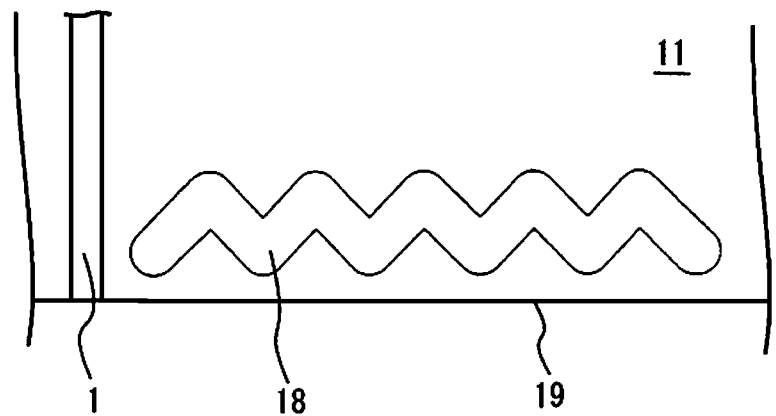
FIG. 4 is a schematic plan view illustrating an example of a depressed portion (a recess)

After this, as shown in FIG. 2F, a third mask 16 that completely covers the p electrode 3 may be formed, and third etching performed. This allows the etching to be performed for a sufficiently long time, so that none of the ITO, etc., will remain un-etched in the region other than the electrode, which is susceptible to the effect of a step and/or the effect of wafer in-plane distribution. As shown in FIG. 4, in the case where the semiconductor layer 11 has a recess 18 on its main face, this etching can sufficiently remove the conductive layer inside the recess 18. The recess 18 is formed near the emission end face 19, and has an undulating shape in plan view, the depth of which is enough to reach the n-type semiconductor layer 8.

It was confirmed that with the laser device obtained by this method, an increase in the voltage applied to the device can be effectively less after a high-temperature test involving drive of the device for 0.5 hour at 400° C., than that of a laser device having a p electrode formed by a conventional method, without using two types of mask (the first mask and the second mask).

Embodiment 2

Figure 5:
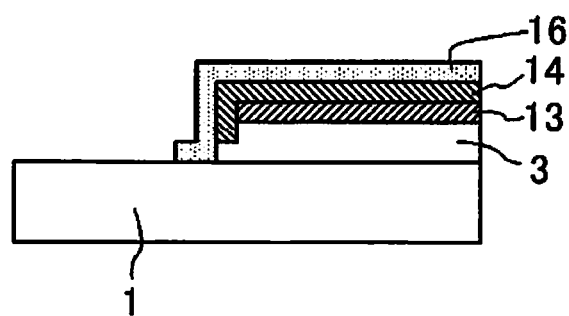
FIG. 5 is a schematic vertical cross sectional view illustrating the method for manufacturing the semiconductor device of Embodiment 2.

As shown in FIG. 5, in the method for manufacturing a laser device in Embodiment 1, the second mask 14 is formed without removing the first mask 13, the third mask 16 is formed without removing these first two masks, and etching is performed using the resulting masks sequentially.

Other than this, the manufacturing method is similar to in Embodiment 1, and has a similar effect to Embodiment 1.

In particular, laminating the first to third masks simplifies the work entailed by the process.

Embodiment 3

Figure 6:
FIG. 6 is a schematic plane view illustrating the method for manufacturing the semiconductor device of Embodiment 3.

As shown in FIG. 6, in the method for manufacturing a laser device in Embodiment 1, a second mask 24 that is larger in the desired location is formed on the first mask 13, and second etching is performed.

Other than this, the manufacturing method is similar to in Embodiment 1, and has a similar effect to Embodiment 1.

In particular, putting the second mask in the desired shape allows the conventional pattern shape to be maintained.

Embodiment 4

Figure 7A:
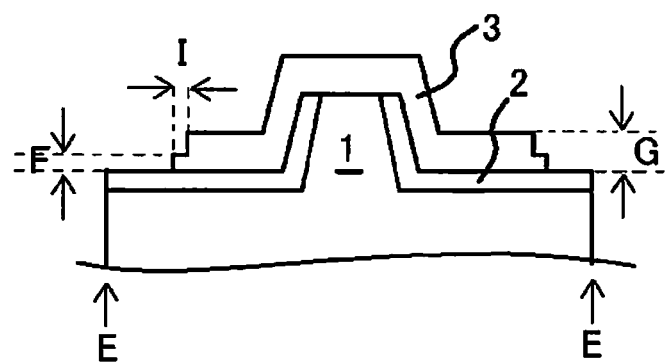
FIG. 7A is a schematic horizontal cross sectional view illustrating the semiconductor device of Embodiment 4.
Figure 7B:
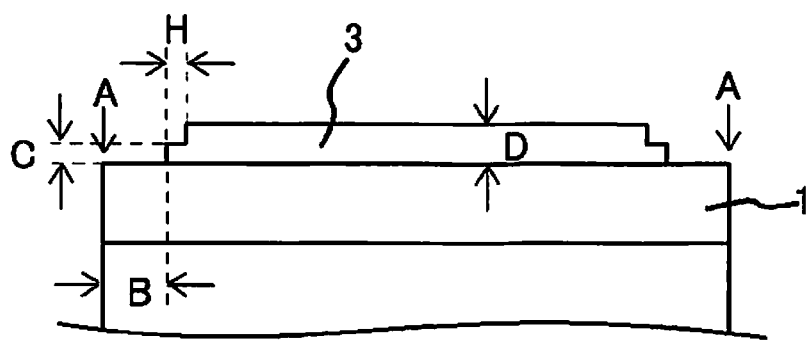
FIG. 7B is a schematic vertical cross sectional view of the semiconductor device of FIG. 7A.
Figure 7C:
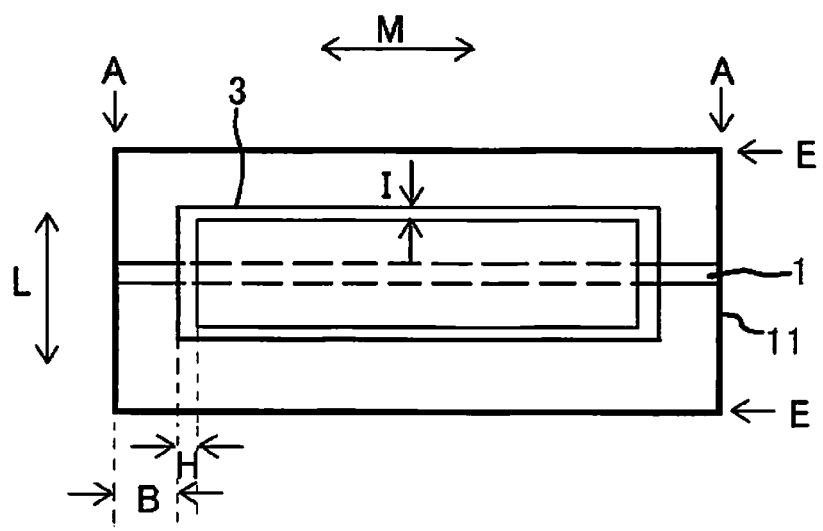
FIG. 7C is a schematic plane view of the semiconductor device of FIG. 7A.

As shown in FIGS. 7A to 7C, the laser device in this embodiment is such that the p electrode 3 is disposed a first distance B in the first direction away from the first end A of the semiconductor layer 11, which is the end that intersects the first direction M, and the thickness C on the first end A side is less than the thickness D on the interior side. Also, the p electrode 3 is located more to the inside than the second end E, which is the end of the semiconductor layer 11 running in the first direction, and the thickness F on the second end E side is less than the thickness GT on the interior side.

Furthermore, the p electrode 3 is such that the electrode width H of the thinner portion on the first end A side is greater than the electrode width I of the thinner portion on the second end E side.

Other than this, the manufacturing method is similar to in Embodiment 1, and has a similar effect to Embodiment 1.

The semiconductor device manufacturing method disclosed herein can be used to particularly good effect in a method for manufacturing a laser device having a ridge.

What is claimed is:

1. A method for manufacturing a semiconductor device, comprising:
    forming a semiconductor layer having a protrusion on a main face, the protrusion having an upper face and side faces;
    forming a conductive layer on a region that includes at least the upper face and the side faces of the protrusion;
    forming a first mask that partially covers a surface of the conductive layer;
    etching a part of the conductive layer by using the first mask in a first etching process;
    forming a second mask that at least partially covers the surface of the conductive layer that has undergone the first etching process; and
    etching a part of the conductive layer by using the second mask to expose a part of the semiconductor layer and to form the conductive layer into an electrode in a second etching process.

2. The method for manufacturing a semiconductor device according to claim 1, wherein at least one of the first etching process and the second etching process is performed by wet etching.

3. The method for manufacturing a semiconductor device according to claim 1, wherein the forming of the conductive layer includes forming the conductive layer from a conductive oxide or an alloy.

4. The method for manufacturing a semiconductor device according to claim 1, wherein the forming of the conductive layer includes forming the conductive layer on a region that includes upper faces of the semiconductor layer on both sides of the protrusion, as well as the region that includes the upper face and the side faces of the protrusion.

5. The method for manufacturing a semiconductor device according to claim 1, wherein the protrusion has a shape that extends in a first direction, and
    the forming of the first mask includes forming the first mask at a first distance away, in the first direction, from a planned division line, which is an imaginary line that intersects the first direction and along which the semiconductor layer is divided after the conductive layer has been formed into the electrode.

6. The method for manufacturing a semiconductor device according to claim 5, wherein the forming of the second mask includes forming the second mask at a second distance away from the planned division line in the first direction, the second distance being shorter than the first distance.

7. The method for manufacturing a semiconductor device according to claim 1, wherein the forming of the semiconductor layer further includes forming a recess on the main surface of the semiconductor layer in a region other than where the protrusion is formed, and
    the forming the conductive layer includes forming a part of the conductive layer within the recess.

8. The method for manufacturing a semiconductor device according to claim 7, further comprising
after the second etching process, forming a third mask that covers from a part of the semiconductor layer exposed by the second etching to the electrode formed by the second etching process, and
etching the part of the conductive layer formed within the recess by using the third mask in a third etching process.

9. A method for manufacturing a semiconductor device, comprising:
forming a semiconductor layer having a protrusion on a main face, the protrusion having at an upper face and side faces;
forming a conductive layer on a region that includes at least the upper face and the side faces of the protrusion;
forming a first mask that partially covers a surface of the conductive layer;
etching a part of the conductive layer by using the first mask in a first etching process;
removing the first mask;
forming a second mask that covers continuously a part of the surface of the conductive layer that is exposed after removal of the first mask and a part of the surface of the conductive layer that has undergone the first etching process; and
etching a part of the conductive layer by using the second mask to expose a part of the semiconductor layer and to form the conductive layer into an electrode in a second etching process.

10. The method for manufacturing a semiconductor device according to claim 9, wherein at least one of the first etching process and the second etching process is performed by wet etching.

11. The method for manufacturing a semiconductor device according to claim 9, wherein the forming of the conductive layer includes forming the conductive layer from a conductive oxide or an alloy.

12. The method for manufacturing a semiconductor device according to claim 9, wherein the forming of the conductive layer includes forming the conductive layer on a region that includes upper faces of the semiconductor layer on both sides of the protrusion, as well as the region that includes the upper face and the side faces of the protrusion.

13. The method for manufacturing a semiconductor device according to claim 9, wherein the protrusion has a shape that extends in a first direction, and
the forming of the first mask includes forming the first mask at a first distance away, in the first direction, from a planned division line, which is an imaginary line that intersects the first direction and along which the semiconductor layer is divided after the conductive layer has been formed into the electrode.

14. The method for manufacturing a semiconductor device according to claim 13, wherein the forming of the second mask includes forming the second mask at a second distance away from the planned division line in the first direction, the second distance being shorter than the first distance.

15. The method for manufacturing a semiconductor device according to claim 9, wherein the forming of the semiconductor layer further includes forming a recess on the main surface of the semiconductor layer in a region other than where the protrusion is formed, and
the forming the conductive layer includes forming a part of the conductive layer within the recess.

16. The method for manufacturing a semiconductor device according to claim 15, further comprising,
after the second etching, forming a third mask that covers from a part of the semiconductor layer exposed by the second etching to the electrode formed by the second etching process, and
etching the part of the conductive layer formed within the recess by using the third mask in a third etching process.

17. A semiconductor device comprising:
a semiconductor layer having a main face and a first end, which is an end that intersects a first direction, the semiconductor layer having a protrusion that protrudes upward and extends in the first direction; and
an electrode disposed on and contacting with at least an upper face of the protrusion, the electrode being disposed at a first distance in the first direction away from the first end, and a thickness of a thin portion of the electrode formed on a first end side being less than a thickness of a thick portion of the electrode formed on an interior side with a lower face of the thin portion being coplanar with a lower face of the thick portion.

18. The semiconductor device according to claim 17, wherein the semiconductor layer includes a second end which is parallel to the first end in the first direction, and
a thickness of a portion of the electrode formed on a second end side is less than the thickness of the portion of the electrode formed on the interior side.

19. The semiconductor device according to claim 18, wherein a width of the portion of the electrode formed on the first end side is greater than a width of the portion of the electrode formed on the second end side.

* * * * *